United States Patent [19]

Barbaza

[11] Patent Number: 5,133,994
[45] Date of Patent: Jul. 28, 1992

[54] PROCESS FOR FORMING A FOLDING OR SEPARATION LINE IN THE MANUFACTURE OF A COMPOSITE MATERIAL COMPONENT

[75] Inventor: François Barbaza, Pauillac, France

[73] Assignee: Societe Europeenne de Propulsion, Suresnes, France

[21] Appl. No.: 668,868

[22] Filed: Mar. 13, 1991

[30] Foreign Application Priority Data

Mar. 15, 1990 [FR] France ............... 90 03347

[51] Int. Cl.$^5$ ............................. C23C 16/00
[52] U.S. Cl. ................. 427/248.1; 427/282
[58] Field of Search .................. 427/248.1, 282

[56] References Cited

FOREIGN PATENT DOCUMENTS 8810245 6/1988 France .

Primary Examiner—Bernard Pianalto
Attorney, Agent, or Firm—Weingarten, Schurgin, Gagnebin & Hayes

[57] ABSTRACT

A masking is provided along the position of one each folding or separation line ($45_1$ to $45_6$), in order to prevent the infiltration of the matrix material into the or each masked zone of the preform. After densification of the preform by chemical vapor deposition and removal of the masking, the or each masked zone of the preform constitutes a flexible bond integrated to the densified preform. Advantageously, the masking of the preform is maintained during a first densification phase until the unmasked parts ($40_1$ to $40_7$) are consolidated. The masking is then removed to obtain flexible bonds integrated to the consolidated preform, allowing the latter to be brought to a shape corresponding to the component by folding along the lines corresponding to the flexible bonds, after which the densification is continued. Alternatively, the masking can be removed only after the final densification to obtain a composite component having one, or a number, of articulations.

6 Claims, 4 Drawing Sheets

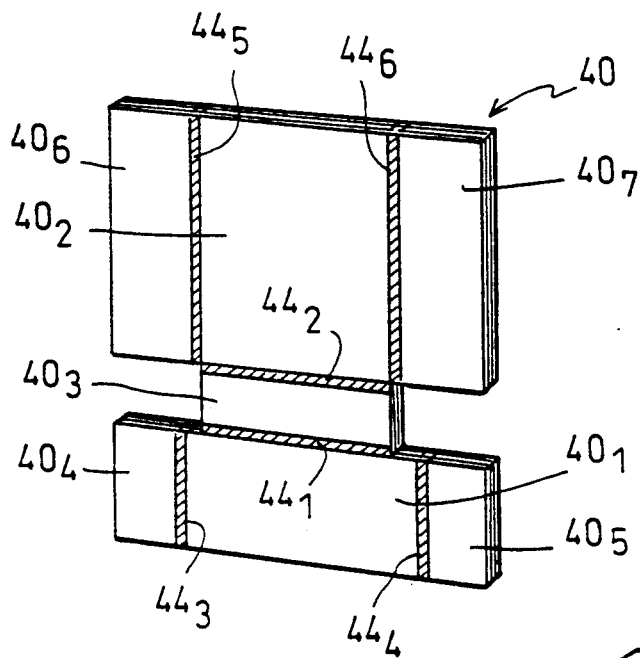
_fig.4A_
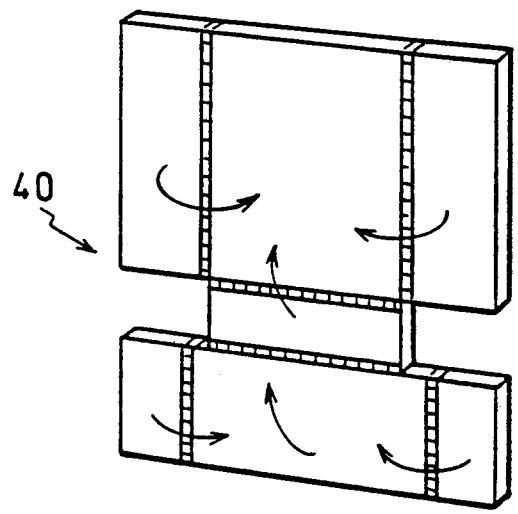
_fig.4B_
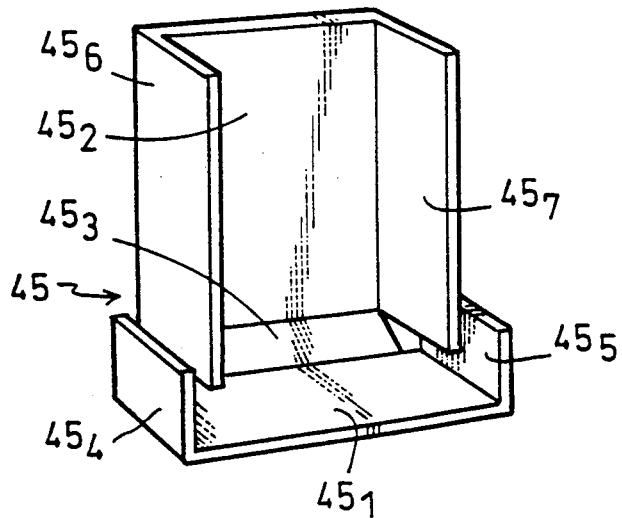
_fig.4C_

PROCESS FOR FORMING A FOLDING OR SEPARATION LINE IN THE MANUFACTURE OF A COMPOSITE MATERIAL COMPONENT

BACKGROUND OF THE INVENTION

1. Field of the invention

The present invention relates to the manufacture of composite material components, and in particular to the manufacture of structural components, involving the steps of making a fibrous preform having substantially the shape of the component to be produced, and densifying the preform with a matrix by chemical vapor deposition within the pores of the preform. Such a process is well known in the art, especially in the manufacture of components made from thermostructural composite materials such as carbon-carbon composites and ceramic matrix composites.

2. Prior art

In the manufacture of a thermostructural composite material component, the fibrous preform is generally made from fibrous textures, such as threads, cloth, fiber webs, felts, or laps of fibers. These textures can be wound or arranged in superposed plies. In the latter case, the plies can be bound together by needling or implanted threads.

Once the preform is made, it is generally inserted in an adapted holding tool in order to be densified by chemical vapor deposition. The tool, which is normally made of graphite, serves to maintain the preform in the desired shape while ensuring, if needs be, a compacting of the preform in order to obtain the required volume ratio of fibers (percentage of the preform's apparent volume occupied by the fibers).

When the preform is sufficiently densified to be effectively consolidated, it is withdrawn from the tool before the chemical vapor deposition is continued until the required degree of densification is achieved.

In the above process, some problems that are difficult or expensive to solve are encountered when manufacturing components having complex shapes.

When dealing with large-size components, one known technique involves making different parts of the component separately, and then assembling those parts. The latter can be made simply at the consolidation stage, that is, when not yet completely densified. The components are then obtained by assembling their constituent parts and co-infiltrating the latter to attain the required degree of densification. The coinfiltration of the matrix within these different parts effectively "glues" the latter together, by virtue of their continuity at the interfaces.

This approach requires that the different parts of the component be made separately. Moreover, the bond between the parts in the finished component can turn out to be inadequate.

For small-size components having a complex shape, it is necessary to call on specially designed tools and/or a substantial amount of machining of the densified parts, which considerably increases costs.

It will be noted that the aforementioned techniques do not make it possible to obtain composite material components having an integrated flexible bond, that is, a deformable component.

SUMMARY OF THE INVENTION WITH OBJECTS

It is an aim of the present invention to overcome the above drawbacks by a process that allows a folding or separation line to be formed during the manufacture of a composite material component.

More particularly, the process according to the present invention is characterized in that there is formed a masking on the preform along the or each separation or folding line, in order to prevent the infiltration of the matrix material in the or each thus-masked zone of the preform, so that after densification the or each masked zone of the preform constitutes a flexible bond that is integrated to the densified preform.

The masking of the or each zone of the preform can be maintained until the final degree of densification is reached, so as to obtain a composite material component having one or a number of integrated flexible bonds constituting one or a number of articulation lines. The masking of the or each zone of the preform may alternatively be removed after a partial densification, or after consolidation of the unmasked zones of the preform. Each masked zone then constitute a flexible bond that allows the preform to be brought to the shape corresponding to the component to be made. The infiltration of the preform is then continued until the final degree of densification is attained, whereupon the bonds become rigidified as a result of being coinfiltrated together with the previously consolidated parts.

The process according to the also finds applications in the manufacture of plural components from a single preform, the flexible bonds being formed along the lines separating the parts of the preform that correspond to the different components. During densification, the flexible bonds allow the preform to be deformed, as required for maintaining the different parts thereof in a shaping tool. After densification, cut-outs are made along the separation lines to obtain the different components.

BRIEF DESCRIPTION OF THE DRAWINGS

The invention shall be more clearly understood upon reading the following description, given purely as a non-limiting example, with reference to the appended drawings in which:

FIGS. 4a–4c illustrate successive stages in the implementation of the invention in a second application thereof.

DETAILED DESCRIPTION OF THE PREFERRED EMBODIMENTS

Figure 1:
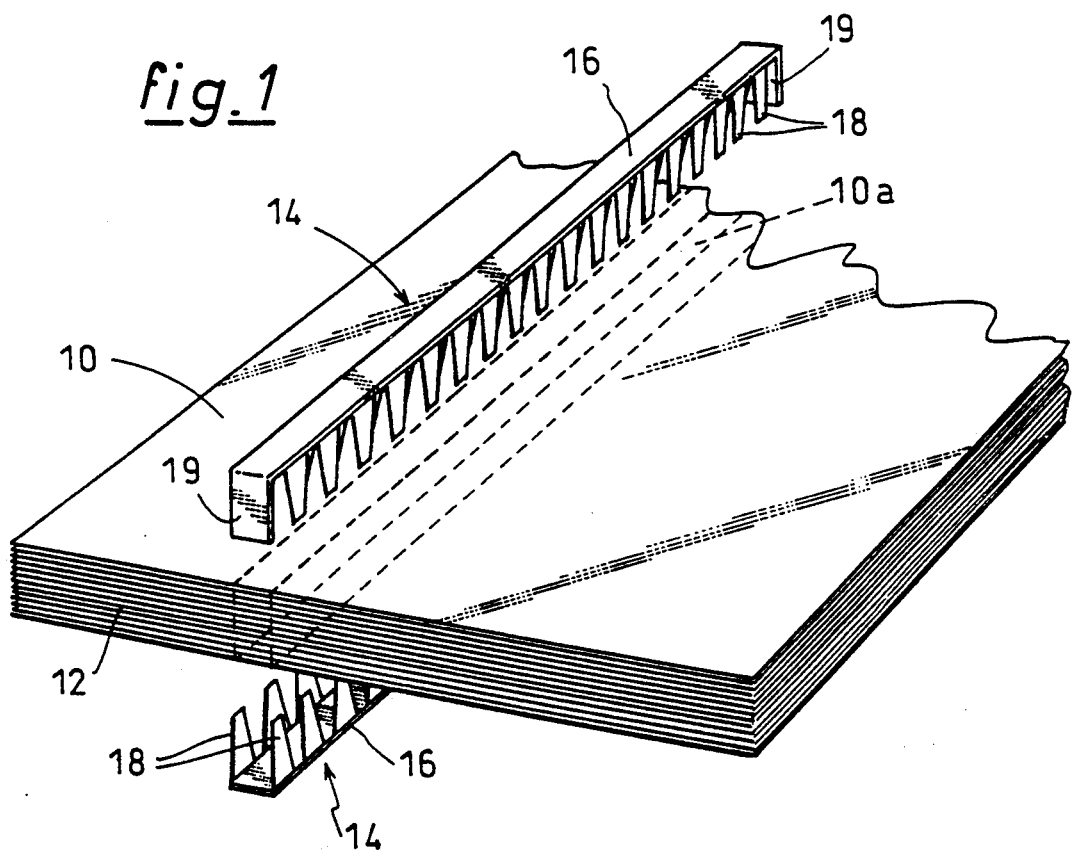
FIG. 1 is a highly schematic illustration of a partial masking of a preform for implementing the process according to a first embodiment of the invention.

FIG. 1 shows a preform 10 intended for the manufacture of a composite material component. In the example, the preform 10 is produced from plies 12 of two-dimensional fibrous texture piled flat. The texture can be made from a cloth or thread layer, or even a complex, consisting of a cloth or thread layer, that is pre-needled to a web of fibers. The plies can be joined by threads implanted across the the superposed plies 12, or by needling the plies.

A folding or separation line is defined on the preform by masking a zone thereof corresponding to the folding or separation line to be formed.

In the example shown in FIG. 1, the masking is obtained by means of two comb or brush-shaped maskers 14 that confront each other on opposite faces of the preform, along the position where the folding or separation line is to be defined.

Each masker 14 comprises a band-shaped portion 16, applied against a face of the preform 10, whose width corresponds to that of the line to be formed. The face of the band 16 contacting the preform is fitted with teeth 18 whose length is equal, or almost equal, to the thickness of the preform. A tooth 18 of one masker penetrates into the preform and lodges between two teeth of the other masker. Each end of at least one of the maskers 14 is provided with an edge portion 19 intended to be be applied against the corresponding side of the preform 10. Accordingly, the bands 16 and teeth 18 define a practically closed volume 10a inside the preform 10.

During the densification of the preform by chemical vapor deposition, the volume 10a is inaccessible, or virtually inaccessible, to the infiltrating gas flow, preventing the densification of that volume 10a in the preform.

When the maskers 14 are removed after the densification, or at least after the consolidation of the preform, they leave behind an un-densified zone 10a, between the densified and rigidified parts of the preform, which constitutes a flexible bond integrated to the preform.

The maskers 14 are made from a material resistant to both the corrosive gas flow used during the chemical vapor deposition and the temperature at which the deposition is carried out. The materials used for the maskers 14 can be graphite or molybdenum.

The maskers 14 are held in place simply by the engagement of their teeth in the fibrous preform. If needs be, the maskers 14 can be joined to each other at their ends by fasteners made of the same material.

Figure 2:
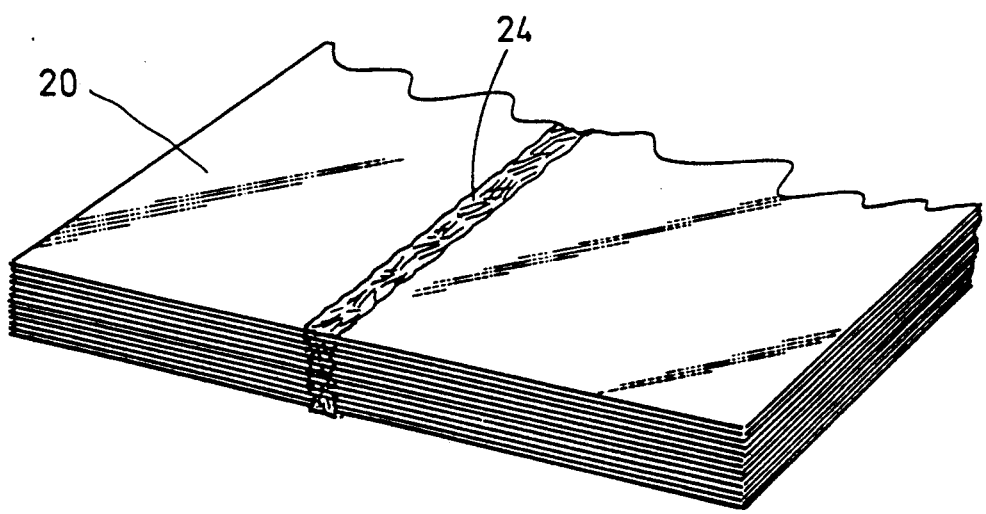
FIG. 2 is a highly schematic illustration of another embodiment of a masking of a preform according to the invention.

FIG. 2 shows a preform 20 analogous to preform 10 of FIG. 1, on which a folding or separation line is defined by local deposition of a masking material at that line. The band-shaped deposit 24 is made on either side of the preform 20.

The deposit 24 is made of a material chosen to be compatible with the subsequent chemical vapor deposition process, and capable of being subsequently removed without damage to the resulting composite material component. When the composite material is of the thermostructural type, with a carbon or ceramic preform and matrix, the masking can be made of molybdenum, which is chemically removable e.g. by dissolving in an acid bath, containing fluorohydric acid, for instance.

The masks 24 are formed by fusing a molybdenum thread or strip. Accordingly, the molybdenum is not only deposited on the surface of the preform 10, but also infiltrates inside the latter. After densification and elimination of the molybdenum, there is obtained a flexible bond integrated to the densified preform.

Figure 3A:
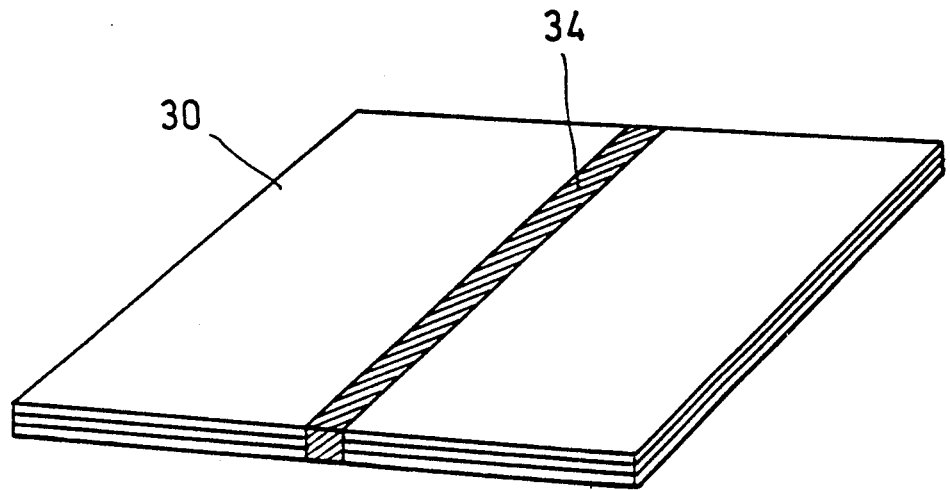
FIGS. 3A and 3B illustrate successive stages in the implementation of the invention in a first application thereof.
Figure 3B:
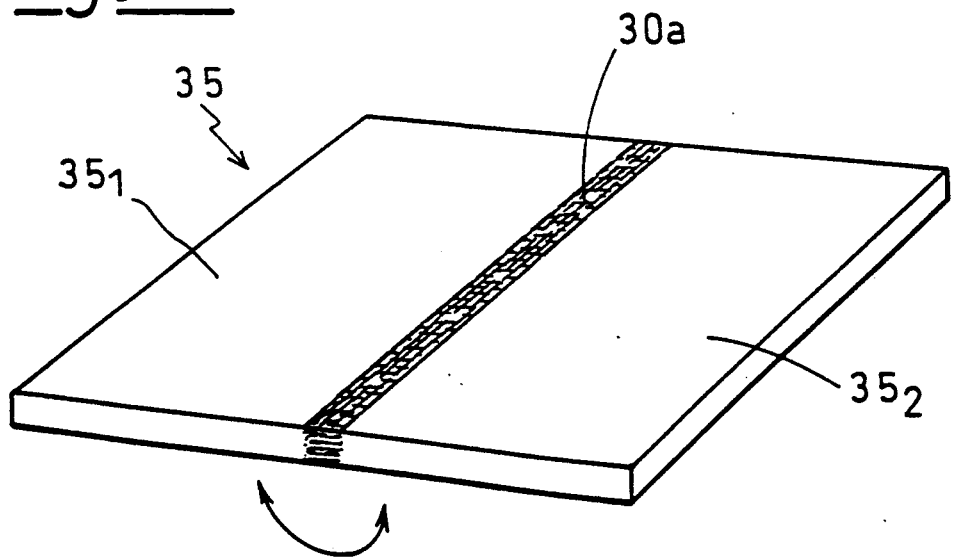

FIGS. 3A and 3B show how the process according to the invention can be used to produce a composite material component consisting of two mutually articulated parts.

A fibrous preform 30, comprised of plies piled flat, is fitted with a mask 34 at the position where the articulation is to be provided in the finished component (FIG. 3A).

The preform 30 is then densified by chemical vapor deposition until the required degree of densification is attained. During a first densification phase, the preform may be held in an adapted tool, which can simply consist of two plates between which the preform is compressed.

After densification, the mask 34 is removed, leaving behind a flexible bond 30a integrated to the resulting component. The bond 30a forms an articulation between the two densified parts $35_1$, $35_2$ located on either side thereof.

FIGS. 4A to 4C show how the process according to the invention can be used to produce a composite material component of complex shape and relatively large dimensions, viz. the frame of a helicopter seat made of ceramic matrix composite material, providing protection from projectiles, possibly in association with other coatings.

The fibrous preform 40 (FIG. 4A) consists of plies piled flat and cut out to define the shape of the seat 45 (FIG. 4C), as layed out flat. In the preform 40, the parts identified by references $40_1$ to $40_7$ respectively correspond to the seat itself $45_1$, the back rest $45_2$, the connecting piece $45_3$ between the seat and the back-rest, the side panels $45_4$ and $45_5$ at the level of the seat, and the side panels $45_6$ and $45_7$ at the level of the back-rest.

The masks $44_1$ to $44_6$ are arranged on the preform 40 at the level of the lines delimiting the aforementioned parts, and a first chemical vapor deposition phase is carried out on the preform 40 to consolidate these different parts. The preform can be held in a tool during this consolidation phase, and withdrawn therefrom during at the end of the consolidation. The tool can simply consist of two plates between which the preform is compressed.

The masks $44_1$ to $44_6$ are then removed, leaving behind flexible bonds between the consolidated portions of the preform. By virtue of these flexible bonds, which form folding lines, the preform 40 can be folded to adopt the shape corresponding to the seat being made (FIG. 4B).

The chemical vapor deposition is then continued, whereby the flexible bonds become densified and rigidified, and the densification of the parts forming the seat 45 is completed.(FIG. 4C). During this final densification, or at least until the flexible bonds are consolidated, the different parts of the seat can be maintained in their folded position by means of an adapted tool. The latter can clearly be much lighter than the tool otherwise required if the different seat parts had not been consolidated. Considering the high cost of graphite holding tools, it can be appreciated that the process according to invention provides substantial savings.

Figure 5A:
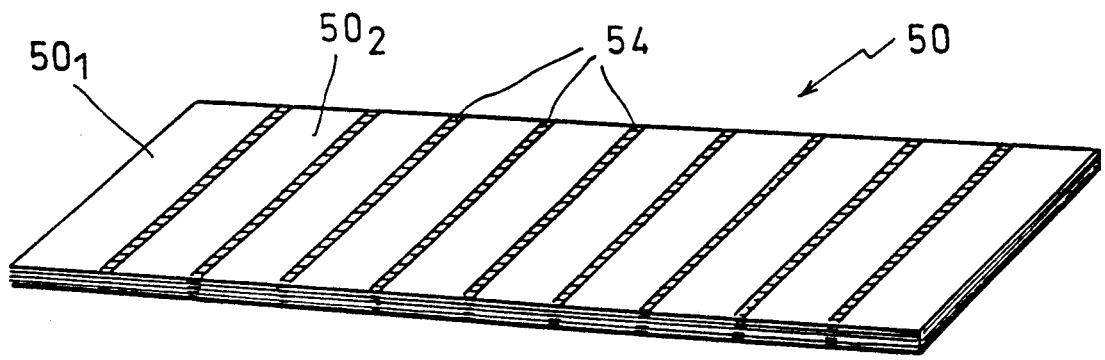
FIGS. 5A and 5B illustrate successive stages in the implementation of the invention in a third application thereof.
Figure 5B:
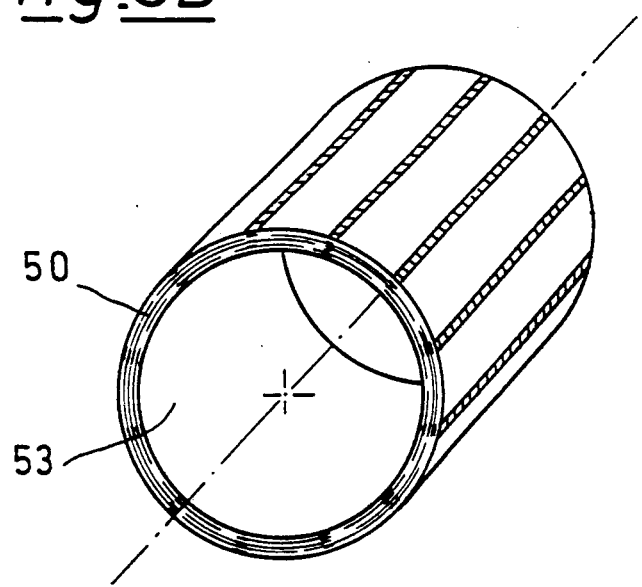

FIGS. 5A and 5B illustrate yet another application of the process according to the present invention.

Here, several components are produced from a common fibrous preform 50 by piling flat a number of plies. Masks 54 are arranged on the preform at the locations of the separation lines between the parts $50_1$, $50_2$, . . . of the preform that correspond to the different components under manufacture.

In the example shown, these components have the shape of cylindrical sectors (portions of a cylinder delimited by two generatrices), such as in the case of nozzle flaps.

After the masks 54 are positioned, the preform 50 is held flat and submitted to a first chemical vapor deposition phase.

After consolidation of the parts of the preform located between the masks 54, the latter are removed, leaving behind flexible bonds between the consolidated parts of the preform corresponding to the components to be made (FIG. 5A). The preform 50 is then placed—and possibly stretched—over a cylindrical shaper or mandrel 53 (FIG. 5B). The flexible bonds allow the preform 50 to fit snugly around the shape of the mandrel. Insofar as the first consolidation is light, the tension of the preform 50 on the mandrel can cause a conformation of the consolidated parts $50_1$ $50_2$, . . . The mandrel thus fulfills the function of a holding tool while being much simpler in structure than the graphite header and shaping die type of tools traditionally used The infiltration of preform 50 on the shaper 53 is then carried out until the required final degree of densification is attained. The thus-obtained components are then separated from each other by cutting along the separation lines.

Alternatively, after a second infiltration phase producing a stronger consolidation, the preform can be withdrawn from the from the mandrel, whereupon the infiltration is continued after separation of the parts of the preform by cutting along the separation lines.

What is claimed is:

1. A process for the manufacture of a composite material component, comprising the steps of making a fibrous preform and densifying said preform by chemical vapor deposition of a matrix within the pores of said preform;

wherein a masking of said preform is carried out along the location of at least one folding or separation lines, in order to prevent the infiltration of the matrix material into at least one masked zone of said preform, whereby, after densification, at least one masked zone of said preform constitutes a flexible bond intregated to said densified preform.

2. Process according to claim 1, wherein said masking is in the form of maskers located on either side of said preform and fitted with teeth that penetrate into said preform so as to provide a barrier against the gaseous flux used during the infiltration of said preform.

3. Process according to claim 1, wherein said masking is obtained by depositing on said preform a material susceptible of being eliminated after infiltration of said preform.

4. Process according to claim 1, wherein said masking of said preform is conserved until a final required degree of densification is attained, so as to obtain, after elimination of said masking, a composite material component having at least one integrated flexible bond forming at least one articulation.

5. Process according to claim 1, wherein: said masking of said preform is retained during a first densification of said preform, lasting at least until the unmasked parts of said preform are consolidated, whereafter said masking is removed so as to leave behind at least one flexible bond integrated to said consolidated preform, said preform thereafter being brought into a shape corresponding to that of said component being manufactured by folding along at least one line corresponding to said at least one flexible bond, and the densification of said preform is thereafter continued, thereby causing said at least one flexible bond to be rigidified.

6. Process according to claim 1, applied for the manufacture of plural composite material components from a single preform, wherein the masking of said preform defines separation lines between parts of said preform corresponding to the components to be manufactured therefrom.

* * * * *